United States Patent [19]

Wakita et al.

[11] Patent Number: 5,122,206

[45] Date of Patent: Jun. 16, 1992

[54] PRECIPITATION HARDENING NICKEL BASE SINGLE CRYSTAL CAST ALLOY

[75] Inventors: Saburo Wakita; Junji Hoshi, both of Ohmiya; Toshiyuki Shimamura, Okegawa; Akira Mitsuhashi, Ohmiya; Toshio Yonezawa, Takasago, all of Japan

[73] Assignee: Mitsubishi Metal Corporation, Tokyo, Japan

[21] Appl. No.: 521,323

[22] Filed: May 9, 1990

[30] Foreign Application Priority Data

May 16, 1989 [JP] Japan ................................. 1-120434
May 16, 1989 [JP] Japan ................................. 1-120435

[51] Int. Cl.$^5$ ........................... C22C 19/15; C22F 1/10
[52] U.S. Cl. ..................................... 148/404; 148/410; 148/428; 420/447; 420/587
[58] Field of Search ............ 148/404, 410, 428; 420/447, 587

[56] References Cited

U.S. PATENT DOCUMENTS 4,421,571 12/1983 Kudo et al. ........................ 420/448
4,459,160 7/1984 Meetham et al. ................. 148/162
4,844,864 7/1989 Frank ................................. 420/448

FOREIGN PATENT DOCUMENTS 1919487 11/1969 Fed. Rep. of Germany .
62-170444 7/1987 Japan .
01-062446 3/1989 Japan .
2105748 3/1983 United Kingdom .

OTHER PUBLICATIONS

Patent Abstracts of Japan, vol. 12, No. 15 (C-569)(2862), Jan. 16, 1988, of JP 62-170,445.

*Primary Examiner*—Melvyn J. Andrews
*Assistant Examiner*—Margery S. Phipps
*Attorney, Agent, or Firm*—Frishauf, Holtz, Goodman & Woodward

[57] ABSTRACT

A precipitation strengthening type nickel base single crystal alloy, which consists essentially of, on a weight percent basis,
10-30% chromium,
0.1-5% niobium,
0.1-8% titanium,
0.1-8% aluminum,
optionally one or more components selected from the group consisting of 0.1-3% tantalum, 0.05-0.5% copper, 0.05-3% hafnium, 0.05-3% rhenium, 0.05-3% molybdenum, 0.05-3% tungsten, 0.05-0.5% boron, 0.05-0.5% zirconium, and
the remainder being nickel and incidental impurities, and exhibits a narrow solidification temperature range.

15 Claims, No Drawings

PRECIPITATION HARDENING NICKEL BASE SINGLE CRYSTAL CAST ALLOY

FIELD OF THE INVENTION

The present invention relates to a precipitation hardening type nickel base single crystal cast alloy, which exhibits a narrow width between the solidus and liquidus, i.e., a narrow zone wherein the solid and liquid metals are coexistent (the zone will hereinafter be designated as a solidification temperature range), and accordingly a tendency to easily form a single crystal cast structure.

More particularly, this nickel base single crystal alloy is essentially comprised of the $\gamma$ phase matrix and intermetallic compound phases, such as $\gamma'$ phase $Ni_3(Al,Ti)$ and $\gamma''$ phase $Ni_3Nb$ precipitated in the matrix, and exhibits a uniform microscopic structure and orientation.

The nickel base alloy exhibits excellent tensile strength and corrosion resistance, and further excellent resistance to stress corrosion cracking, when used, for example, in bolts and pins which are fabricating members in the construction of light water furnaces of atomic energy power plants being exposed to a corrosive environment.

BACKGROUND OF THE INVENTION

A nickel base alloy comprising, on a weight percent basis, 12-30% chromium, 0.5-3% niobium, 1-5% titanium, 0.2-3% aluminum and the remainder nickel and incidental impurities was, for example, proposed by Japanese Patent Public Disclosure No. 170445/87, an example of said nickel base alloy is comprised essentially of the $\gamma$ phase matrix and intermetallic compound phases, such as $\gamma'$ phase $Ni_3(Al,Ti)$ and $\gamma''$ phase $Ni_3Nb$ precipitated in the matrix, and exhibits a uniform microscopic structure and orientation and also exhibits excellent tensile strength, corrosion resistance and stress corrosion cracking resistance.

This alloy has been used in producing the above-mentioned bolts and pins as it exhibits excellent corrosion resistance and high tensile strength both characteristics being required for such pins and bolts.

Although this conventional precipitation strengthening type nickel base single crystal alloy exhibits high tensile strength and excellent corrosion resistance when exposed to a corrosive environment under ordinary circumstances, it cannot exhibit satisfactory corrosion resistance when stresses are applied to the alloy articles, such as bolts. Accordingly, the conventional nickel alloy has a tendency to crack due to stress corrosion. On the other hand, since the nickel alloy has a relatively wide solidification temperature range, a pulling down velocity of a melt in the mold in production of a single structure casting structure using a unidirectional solidifying furnace must be made considerably slow. This means that control of a pulling down velocity for producing the single crystal structure in castings, particularly in large sized castings, is very difficult.

With a view to imparting excellent stress corrosion resistance to the conventional precipitation strengthening nickel base alloy while maintaining high tensile strength and excellent corrosion resistance, efforts are being made to develop a novel precipitation strengthening type single crystal nickel base alloy. As a result of such efforts, the inventors of the present invention have found that the stress corrosion crack resistance of the conventional nickel alloy can be improved by adding small amounts of copper thereto and further improved by adding small amounts of hafnium or rhenium or both and that the corrosion resistance of the alloy can be improved by adding small amounts of molybdenum or tungsten or both to the alloy. As a result of studies conducted with the aim of narrowing the solidification temperature range of the conventional precipitation strengthening type nickel base single crystal alloy, the inventors have also found that the solidification temperature range can be remarkably narrowed by adding a small amount of tantalum to the alloy and that therefore large sized castings can be produced with a single crystal structure.

SUMMARY OF THE INVENTION

The first invention of the present application has been accomplished on the basis of these findings and provides a precipitation strengthening type nickel base single crystal alloy which consists essentially of, on a weight percent basis,
- 10-30% chromium,
- 0.1-5% niobium,
- 0.1-8% titanium,
- 0.1-8% aluminum,
- 0.05-0.5% copper,
- optionally, 0.05-3% of hafnium or rhenium or both,
- optionally, 0.05-3% of molybdenum or tungsten or both,
- optionally, 0.05-0.5% of boron or zirconium or both, and
- the remainder being nickel and incidental impurities, and exhibits high tensile strength, corrosion resistance and stress corrosion resistance.

The second invention of the present application has also been accomplished on the basis of the above-mentioned findings and provides another precipitation strengthening type nickel base single crystal alloy, which consists essentially of, on a weight percent basis,
- 10-30% chromium,
- 0.1-5% niobium,
- 0.1-8% titanium,
- 0.1-8% aluminum,
- 0.1-3% tantalum,
- optionally, one or more components selected from the group consisting of 0.05-0.5% copper, 0.05-3% hafnium and 0.05-3% rhenium, sum of copper, hafnium and rhenium being restricted in the range of not more than 3%,
- optionally, 0.05-3% of molybdenum or tungsten or both,
- optionally, 0.05-0.5% of boron or zirconium or both, and
- the remainder being nickel and incidental impurities, and exhibits a narrow solidification temperature range.

DETAILED DESCRIPTION OF THE INVENTION

I. The criticality of the compositional range by weight of each of the alloying elements in the nickel base single crystal cast alloys of the first invention of the present application is described below.

(a) Chromium

Chromium contributes to an improvement in the corrosion resistance of the alloy. If its content is less than 10%, a desirable corrosion resistance cannot be ensured, on the other hand, if the content exceeds 30%, the solidification temperature range of the alloy tends to become wide and therefore it becomes difficult to form the single crystal structure. Consequently, the resultant alloy tends to form a polycrystalline structure. The stress corrosion cracking resistance of a polycrystalline alloy is inferior to that of a single crystal alloy, and accordingly the content of chromium is limited so as to be within a range of 10 to 30%.

(b) Niobium

Niobium combines with nickel to form a $\gamma''$ phase comprising an intermetallic compound ($Ni_3Nb$) which precipitates in the matrix of the alloy and increases the tensile strength thereof. If the content of niobium is less than 0.1%, the desired alloy strength cannot be obtained, whereas, if the niobium content exceeds 5%, the tensile strength of the resultant alloy shows no further improvement. The niobium content is therefore limited to a range of 0.1–5%.

(c) Titanium and Aluminum

These elements combine with nickel to form a $\gamma'$ phase comprising a complex intermetallic compound $[Ni_3(Ti,Al)]$ which precipitates in the matrix of the alloy together with the above-mentioned $\gamma''$ phase and remarkably increases the tensile strength of the resultant alloy. If the content of titanium and that of aluminum are less than 0.1%, respectively, desired improvement in the tensile strength for the resultant alloy cannot be effected. On the other hand, if the titanium content and aluminum content exceed 8%, respectively, the solidification temperature range is widened and accordingly it becomes difficult to form a single crystal structure, as similarly seen in a case that an excess amount of chromium is added to the alloy. Both the titanium content and aluminium content are therefore restricted in a range of 0.1 to 8%.

(d) Copper

Copper improves the resistance of the nickel base single crystal alloy to stress corrosion cracking. If the copper content is less than 0.05%, level of resistance in the alloy to stress corrosion cracking cannot be attained. On the other hand, if the copper content exceeds 0.5%, the tensile strength of the resultant alloy decreases. The copper content is therefore limited to a range of 0.05–0.5%.

(e) Hafnium and Rhenium

These elements effect a distinct improvement in the stress corrosion cracking resistance of the nickel base alloy together with copper. Accordingly, if necessary, one or both of these elements can be added to the alloy. If the content of hafnium or rhenium or a combination of both is less than 0.05%, respectively, a desired level of the stress corrosion cracking resistance cannot be attained, whereas more than 3% of the content of hafnium or rhenium or a combination of both causes an embrittlement of the resultant alloy. The content of hafnium and/or rhenium is therefore restricted to be in the range of 0.05–3%.

(f) Molybdenum and Tungsten

These are optional elements, which effect a distinct improvement in the corrosion resistance of the nickel base single crystal alloy together with chromium. One or both of these elements are therefore, if necessary, added to the nickel base alloy. If the content of molybdenum or tungsten or both is less than 0.05%, the desired corrosion resistance of the nickel alloy cannot be obtained. On the other hand, if the content of molybdenum or tungsten or both exceeds 3%, the resultant nickel alloy tends to become brittle. The content of molybdenum or tungsten or both is therefore limited to a range of 0.05–3%.

(g) Boron and Zirconium

If one or both of these elements are incorporated into the nickel base single crystal alloy of the first invention, the element or elements segregate on the surface of dendrites and, as a result of such segregation, the machinability of the resultant alloy is much improved. These elements are therefore incidentally incorporated into the alloy when it is particularly required for it to have a free cutting property. If the content of boron or zirconium is less than 0.005%, the desired level of machinability is not attained, whereas if the content of boron or zirconium or both exceed 0.5%, the tensile strength of the alloy tends to decrease. The content of boron or zirconium or both are therefore restricted to a range of 0.005–0.5%.

II. The criticality of the compositional range by weight of each of the alloying elements in the nickel base single crystal cast alloys of the invention of the present application is described below.

(a) Chromium, Niobium and "Titanium and Aluminum"

The reason for the restriction of the content of each of these elements to the above described and claimed ranges is the same as that explained in relation to the first nickel base single crystal cast alloy.

(b) Tantalum

Tantalum narrows the solidification temperature range and facilitates the forming of a single crystal in a cast piece. If the tantalum content is less than 0.1%, the desired level of such effects cannot be obtained. Whereas, if the tantalum content exceeds 3%, the effect of tantalum tends to saturate and the further improvement in the effects cannot be attained. The tantalum content is therefore limited to a range of 0.1–3%.

(c) Copper, Hafnium and Rhenium

These elements are optional elements, but distinctly improve the stress corrosion cracking resistance of the nickel alloy. If the content of any one of these elements is less than the desired level of such stress corrosion resistance 0.05%, the resultant alloy cannot exhibit the desired level of such stress corrosion cracking resistance. On the other hand, if the copper content exceeds 0.5%, the hafnium or rhenium content exceeds 3%, respectively, and the sum of these elements exceeds 3%, tensile strength of the resultant alloy is reduced. Accordingly, the copper content is restricted to 0.05–0.5%, the hafnium and rhenium contents are restricted to 0.05–3%, respectively, and the sum of these elements is restricted so as not to exceed 3%.

(d) Molybdenum and Tungsten

The reason why the molybdenum content and the tungsten content are restricted to the above mentioned ranges is the same as that for the alloy of the first invention.

(e) Boron and Zirconium

The reason why the content of boron and zirconium are restricted to the above mentioned ranges, respectively, is the same as that for the alloy of the first invention.

Now, some detailed embodiments of the first and second inventions of the present application will be hereinafter described by means of Examples.

EXAMPLE 1

A nickel base single crystal alloy of the first invention will hereinafter be described in detail.

A group of alloys having the compositions shown in Table 1 were melted in an ordinary high frequency induction furnace and the resultant melts were cast into ingots, each, respectively, having a diameter of 80 mm and a length of 100 mm. Each of the ingots were then remelted in a crucible in a vacuum furnace and cast into a ceramic mold in the same vacuum furnace. The ceramic mold was pulled downwards through a heating zone formed by a high induction heating coil which was wound about the ceramic mold at its initial location with a pulling-down velocity of 100-300 mm/hr to form round bar shaped cast pieces, each having an outer diameter of 10 mm and a length of 100 mm. The cast piece was then subjected to a solution treatment including heating at temperatures of 900°-1300° C. for 60-180 minutes and aging at 500°-900° C. for 100-200 hours. As a result of these heat treatments, a series of test specimens No. 1-25 of the alloy of the first invention and another series of comparative nickel base alloy test specimens No. 1-9 were produced. Any of these comparative test specimens No. 1-9 made from the nickel base alloy having an alloying element content outside the scope of the present invention is indicated by asterisks in Table 1.

Then, the resultant nickel base alloy test specimens were subjected to a microscopic inspection in order to observe their crystalline structures and a tensile test in order to evaluate the strength of the nickel base alloy test specimens at room temperature. In addition to these tests, small sized test specimens each having a diameter of 5 mm at a reduced section and a gauge length of 20 mm were cut out of each of the specimens. The small sized test specimens were first dipped in an aqueous solution held in a pressurized oven and containing $H_3BO_3$ (as B) about 500 ppm, LiOH (as Li) about 2 ppm, $H_2$ about 30 cc STP/kg $H_2O$, DO less than 5 ppb and $Cl^-$ less than 0.1 ppm and kept at a PH value of about 7. This environment to which the test specimen was subjected is very similar to an environment which is formed in the light water type atomic energy power plant and to which bolts and pins are exposed. Then the test specimens were subjected to a slow strain rate tensile test at temperature of 320° C., with a pressure of 157 $kg/cm^2$ and a stress velocity of 0.5 $\mu m/min$, and the stress corrosion cracking fracture rate was measured for each test specimens by examining a fracture surface of each of the test specimens after they had fractured.

A corrosion test was also conducted in order to evaluate the corrosion resistance of the test specimens, by dipping each of the test specimens in the above-mentioned aqueous solution kept at room temperature, for 500 hours and the weight loss due to corrosion was measured for each of the test specimens.

Results of these tests are shown in Table 2.

TABLE 1

| | composition (weight %) | | | | | | | | | | | |
|---|---|---|---|---|---|---|---|---|---|---|---|---|
| | Cr | Nb | Ti | Al | Cu | Hf | Re | Mo | W | B | Zr | Ni – impurities |
| cast pieces of Ni base alloys of the present invention | | | | | | | | | | | | |
| 1 | 10.4 | 1.01 | 5.02 | 5.00 | 0.12 | — | — | — | — | — | — | remainder |
| 2 | 20.6 | 1.03 | 5.11 | 5.02 | 0.20 | — | — | — | — | — | — | " |
| 3 | 29.6 | 0.97 | 5.05 | 4.79 | 0.13 | — | — | — | — | — | — | " |
| 4 | 20.1 | 0.12 | 5.07 | 4.52 | 0.15 | — | — | — | — | — | — | " |
| 5 | 19.8 | 4.91 | 4.66 | 4.35 | 0.18 | — | — | — | — | — | — | " |
| 6 | 20.0 | 1.21 | 0.13 | 6.57 | 0.20 | — | — | — | — | — | — | " |
| 7 | 22.5 | 1.20 | 7.94 | 1.09 | 0.21 | — | — | — | — | — | — | " |
| 8 | 18.2 | 1.18 | 6.35 | 0.12 | 0.14 | — | — | — | — | — | — | " |
| 9 | 21.1 | 1.05 | 1.77 | 7.96 | 0.18 | — | — | — | — | — | — | " |
| 10 | 18.7 | 1.04 | 4.46 | 4.28 | 0.07 | — | — | — | — | — | — | " |
| 11 | 18.3 | 1.16 | 4.38 | 4.25 | 0.48 | — | — | — | — | — | — | " |
| 12 | 18.6 | 1.22 | 4.79 | 4.29 | 0.07 | 0.06 | — | — | — | — | — | " |
| 13 | 19.0 | 1.03 | 5.04 | 4.24 | 0.07 | 1.53 | — | — | — | — | — | remainder |
| 14 | 19.5 | 1.21 | 5.03 | 4.08 | 0.07 | 2.94 | — | — | — | — | — | " |
| 15 | 19.8 | 1.05 | 5.01 | 4.01 | 0.07 | — | 0.06 | — | — | — | — | " |
| 16 | 20.2 | 1.24 | 4.82 | 4.57 | 0.07 | — | 1.49 | — | — | — | — | " |
| 17 | 20.6 | 1.16 | 4.97 | 4.53 | 0.07 | — | 2.96 | — | — | — | — | " |
| 18 | 19.7 | 1.21 | 4.88 | 4.33 | 0.18 | 0.64 | 0.75 | — | — | — | — | " |
| 19 | 19.6 | 1.14 | 4.96 | 4.67 | 0.07 | — | 0.08 | 0.13 | — | — | — | " |
| 20 | 20.3 | 1.16 | 5.02 | 5.01 | 0.12 | 0.12 | — | 1.64 | — | — | — | " |
| 21 | 20.4 | 1.05 | 5.04 | 5.05 | 0.14 | 0.14 | 0.08 | 2.94 | — | — | — | " |
| 22 | 21.0 | 1.20 | 5.02 | 4.96 | 0.21 | 0.12 | — | — | 0.12 | — | — | " |
| 23 | 18.5 | 1.22 | 4.97 | 4.72 | 0.14 | 0.09 | 0.10 | — | 1.36 | — | — | " |
| 24 | 19.2 | 1.04 | 4.98 | 5.04 | 0.16 | — | 0.13 | — | 2.87 | — | — | " |
| 25 | 20.3 | 1.07 | 5.00 | 5.07 | 0.18 | 0.08 | — | 1.10 | 1.04 | — | — | remainder |
| 26 | 19.3 | 0.81 | 4.69 | 3.01 | 0.12 | — | — | — | — | 0.08 | — | " |
| 27 | 18.5 | 1.03 | 4.82 | 4.03 | 0.15 | — | — | — | — | — | 0.18 | " |
| 28 | 18.4 | 1.24 | 4.51 | 4.20 | 0.20 | — | — | — | — | 0.15 | 0.09 | " |
| 29 | 19.8 | 1.14 | 4.81 | 3.95 | 0.21 | 0.48 | 0.24 | 0.81 | 0.12 | 0.11 | 0.21 | " |
| cast pieces of comparative Ni base alloys | | | | | | | | | | | | |
| 1 | 8.6* | 1.05 | 4.77 | 5.08 | 0.16 | — | — | — | — | — | — | remainder |
| 2 | 31.8* | 1.14 | 5.79 | 5.13 | 0.17 | — | — | — | — | — | — | " |
| 3 | 19.5 | —* | 5.04 | 5.27 | 0.20 | — | — | — | — | — | — | " |
| 4 | 19.4 | 1.23 | 0.07* | 5.09 | 0.21 | — | — | — | — | — | — | " |
| 5 | 20.1 | 1.07 | 9.32* | 1.83 | 0.21 | — | — | — | — | — | — | " |

TABLE 1-continued

| | composition (weight %) | | | | | | | | | | | |
|---|---|---|---|---|---|---|---|---|---|---|---|---|
| | Cr | Nb | Ti | Al | Cu | Hf | Re | Mo | W | B | Zr | Ni + impurities |
| 6 | 20.6 | 1.15 | 4.67 | 0.08* | 0.18 | — | — | — | — | — | — | " |
| 7 | 20.3 | 1.09 | 2.54 | 8.88* | 0.21 | — | — | — | — | — | — | " |
| 8 | 20.2 | 1.08 | 4.92 | 5.07 | —* | — | — | — | — | — | — | " |
| 9 | 20.1 | 1.05 | 4.94 | 5.03 | 0.64* | — | — | — | — | — | — | " |

*outside the scope of the present invention

TABLE 2

| | crystal structure | tensile strength (kg/mm$^2$) | stress corrosion crack fracture ratio (%) | corrosion loss (mg/cm$^2$) |
|---|---|---|---|---|
| cast pieces of Ni base alloys of the present invention | | | | |
| 1 | single crystal | 147.9 | 0 | 4.0 |
| 2 | " | 145.2 | 0 | 2.6 |
| 3 | " | 130.4 | 3 | 1.6 |
| 4 | " | 121.4 | 0 | 2.7 |
| 5 | " | 151.7 | 0 | 2.9 |
| 6 | " | 116.7 | 0 | 3.0 |
| 7 | " | 148.3 | 0 | 3.3 |
| 8 | " | 124.7 | 0 | 3.0 |
| 9 | " | 149.9 | 0 | 3.0 |
| 10 | " | 142.7 | 3 | 3.0 |
| 11 | " | 126.2 | 0 | 2.6 |
| 12 | " | 146.3 | 2 | 2.7 |
| 13 | " | 135.1 | 0 | 2.7 |
| 14 | " | 123.5 | 0 | 2.8 |
| 15 | " | 146.1 | 2 | 2.6 |
| 16 | " | 137.5 | 0 | 2.7 |
| 17 | " | 129.8 | 0 | 2.6 |
| 18 | " | 138.2 | 0 | 2.7 |
| 19 | " | 144.8 | 1 | 2.4 |
| 20 | " | 137.1 | 0 | 2.0 |
| 21 | " | 121.5 | 0 | 1.6 |
| 22 | " | 146.0 | 0 | 2.4 |
| 23 | " | 136.3 | 0 | 2.1 |
| 24 | single crystal | 122.7 | 0 | 1.8 |
| 25 | " | 128.3 | 0 | 1.4 |
| 26 | " | 146.3 | 0 | 3.0 |
| 27 | " | 142.1 | 0 | 3.2 |
| 28 | " | 123.6 | 0 | 2.9 |
| 29 | " | 121.8 | 0 | 2.2 |
| cast pieces of comparative Ni base alloys | | | | |
| 1 | single crystal | 148.1 | 0 | 6.7 |
| 2 | multiple crystal | 64.7 | 21 | 1.4 |
| 3 | single crystal | 97.9 | 0 | 3.1 |
| 4 | " | 96.5 | 0 | 3.0 |
| 5 | multiple crystal | 55.0 | 25 | 3.5 |
| 6 | single crystal | 99.2 | 0 | 3.1 |
| 7 | multiple crystal | 54.6 | 27 | 3.0 |
| 8 | single crystal | 145.1 | 8 | 2.8 |
| 9 | " | 89.4 | 0 | 2.9 |

It is apparent from the test results in the Table 1 that nickel base alloy test specimens No. 1-29 of the present invention have a single crystal structure composed of γ phase matrix and intermetallic compounds of γ' and γ" phases precipitated and dispersed in the matrix, exhibited high tensile strength and excellent stress corrosion cracking resistance, in particular, as compared with the conventional comparative nickel base single crystal alloy test specimens including the No. 8 test specimen.

On the other hand, the conventional comparative nickel base single crystal alloy test specimens No. 1-9, which have an alloying element content outside the scope of the present invention, clearly exhibit some inferior properties to those of the nickel alloy of the present invention. Additionally, the stress corrosion cracking resistance of the nickel alloy has been improved by adding hafnium or rhenium or both thereto, and the corrosion resistance of the nickel base alloy has been improved by adding molybdenum and tungsten thereto. The resultant nickel base alloy can be therefore used in fabricating parts and members of, for example, the light water furnace of an atomic energy power plant operated under a corrosive environment, due to its high, stable and reliable performance over prolonged periods of time.

EXAMPLE 2

A nickel base single crystal alloy of the second invention will hereinafter be described in detail.

A group of alloys having the compositions shown in Table 3 were melted in an ordinary high frequency induction furnace and the resultant melts were cast into ingots, each, respectively, having a diameter of 80 mm and a length of 100 mm. Each of the ingots were then remelted in a crucible in a vacuum furnace and cast into a ceramic mold in the same vacuum furnace. The ceramic mold was pulled downwards through a heating zone formed by a high induction heating coil which was wound about the ceramic mold at its initial location with a pulling-down velocity of 100-300 mm/hr to form round bar shaped cast pieces, each having an outer diameter of 20 mm and a length of 100 mm. The cast piece was then subjected to a solution treatment including heating at temperatures of 900°-1300° C. for 60-180 minutes and aging at 500°-900° C. for 100-200 hours. As a result of these heat treatments, a series of test specimens No. 30-65 of the alloy of the first invention and another series of comparative nickel base alloy test specimens No. 10-17 were produced. Any of these comparative test specimens No. 10-17 made from the nickel base alloy having an alloying element content outside the scope of the present invention is indicated by asterisks in Table 3.

Then, the resultant nickel base alloy test specimens were subjected to a microscopic inspection in order to observe their crystalline structures and a tensile test in order to evaluate the strength of the nickel base alloy test specimens at room temperature. In addition to these tests, small sized test specimens each having a diameter of 5 mm at a reduced section and a gauge length of 20 mm were cut out of each of the specimens. The small sized test specimens were first dipped in an aqueous solution containing H3B03 (as B) about 350 ppm, LiOH (as Li) about 2 ppm, H$_2$ about 30 cc STP/kg H$_2$O, DO less than 5 ppb and Cl$^-$ less than 0.1 ppm and maintained at a PH value of about 7 and kept in a pressurized oven. This environment to which the test specimen was subjected is very similar to that which is formed in a light water type atomic energy power plant and to which bolts and pins are exposed therein. Then the test specimens was measured by the differential thermal analysis method.

TABLE 3

| | composition (weight %) | | | | | | | | | | | | |
|---|---|---|---|---|---|---|---|---|---|---|---|---|---|
| | Cr | Nb | Ti | Al | Ta | Cu | Hf | Re | Mo | W | B | Zr | Ni + impurities |
| cast pieces of Ni base alloys of the present invention | | | | | | | | | | | | | |
| 30 | 10.8 | 1.11 | 6.05 | 5.10 | 1.05 | — | — | — | — | — | — | — | remainder |
| 31 | 20.1 | 1.12 | 6.01 | 5.22 | 1.03 | — | — | — | — | — | — | — | " |
| 32 | 29.6 | 1.10 | 5.94 | 5.07 | 1.05 | — | — | — | — | — | — | — | " |
| 33 | 18.5 | 0.11 | 6.20 | 5.70 | 0.98 | — | — | — | — | — | — | — | " |
| 34 | 18.7 | 4.82 | 5.12 | 3.53 | 1.67 | — | — | — | — | — | — | — | " |
| 35 | 18.6 | 0.99 | 0.12 | 5.16 | 0.98 | — | — | — | — | — | — | — | " |
| 36 | 18.8 | 0.97 | 7.91 | 3.18 | 1.04 | — | — | — | — | — | — | — | " |
| 37 | 20.5 | 1.16 | 6.03 | 0.11 | 1.00 | — | — | — | — | — | — | — | " |
| 38 | 20.3 | 1.03 | 2.33 | 7.86 | 0.95 | — | — | — | — | — | — | — | " |
| 39 | 18.1 | 1.12 | 6.07 | 5.02 | 0.12 | — | — | — | — | — | — | — | " |
| 40 | 18.6 | 1.10 | 6.05 | 5.11 | 2.93 | — | — | — | — | — | — | — | " |
| 41 | 29.2 | 1.11 | 5.62 | 5.08 | 1.01 | 0.06 | — | — | — | — | — | — | " |
| 42 | 29.5 | 1.11 | 5.88 | 5.04 | 0.96 | 0.42 | — | — | — | — | — | — | remainder |
| 43 | 29.5 | 1.08 | 5.94 | 5.02 | 0.97 | — | 0.08 | — | — | — | — | — | " |
| 44 | 28.9 | 0.96 | 5.90 | 5.03 | 0.97 | — | 2.31 | — | — | — | — | — | " |
| 45 | 29.0 | 0.95 | 6.11 | 4.91 | 1.00 | — | — | 0.07 | — | — | — | — | " |
| 46 | 29.1 | 1.04 | 6.04 | 4.89 | 1.05 | — | — | 1.56 | — | — | — | — | " |
| 47 | 29.5 | 1.09 | 6.08 | 4.95 | 0.98 | 0.24 | 1.41 | — | — | — | — | — | " |
| 48 | 28.8 | 1.00 | 5.81 | 5.26 | 0.97 | 0.13 | — | 2.33 | — | — | — | — | " |
| 49 | 28.5 | 1.03 | 5.96 | 5.13 | 1.03 | — | 0.16 | 0.69 | — | — | — | — | " |
| 50 | 28.7 | 1.13 | 6.15 | 5.01 | 1.04 | 0.30 | 0.74 | 0.52 | — | — | — | — | " |
| 51 | 19.4 | 1.07 | 6.03 | 5.08 | 1.00 | — | — | — | 0.11 | — | — | — | " |
| 52 | 20.2 | 0.94 | 5.87 | 5.17 | 0.83 | — | — | — | 2.33 | — | — | — | " |
| 53 | 20.5 | 0.98 | 5.88 | 5.15 | 0.89 | — | — | — | — | 0.26 | — | — | " |
| 54 | 18.6 | 0.95 | 5.91 | 5.09 | 0.95 | — | — | — | — | 1.54 | — | — | remainder |
| 55 | 19.3 | 0.94 | 6.08 | 5.03 | 1.12 | — | — | — | 1.04 | 0.64 | — | — | " |
| 56 | 20.4 | 1.10 | 6.10 | 5.02 | 0.97 | 0.33 | — | — | — | 2.81 | — | — | " |
| 57 | 21.0 | 1.04 | 6.14 | 4.96 | 1.05 | — | 0.94 | — | 0.43 | — | — | — | " |
| 58 | 18.1 | 1.02 | 5.87 | 4.99 | 1.02 | — | — | 0.98 | 0.81 | 0.12 | — | — | " |
| 59 | 18.7 | 0.97 | 5.82 | 5.39 | 0.95 | 0.24 | 2.01 | — | 2.94 | — | — | — | " |
| 60 | 18.6 | 0.95 | 6.09 | 5.07 | 0.98 | — | 0.24 | 0.24 | 0.36 | 0.58 | — | — | " |
| 61 | 18.9 | 0.92 | 6.11 | 5.05 | 1.04 | 0.21 | 0.48 | 1.12 | 1.01 | 1.21 | — | — | " |
| 62 | 21.2 | 0.95 | 5.72 | 4.13 | 0.89 | 0.21 | — | — | — | — | 0.12 | — | " |
| 63 | 18.8 | 0.94 | 5.25 | 3.98 | 1.00 | 0.18 | — | — | — | — | — | 0.40 | " |
| 64 | 19.5 | 1.07 | 5.89 | 4.21 | 0.97 | 0.30 | — | — | — | — | 0.14 | 0.25 | " |
| 65 | 18.4 | 1.04 | 5.53 | 4.18 | 0.93 | 0.27 | 0.21 | 0.41 | 0.90 | 1.00 | 0.08 | 0.21 | " |
| cast pieces of comparative Ni base alloys | | | | | | | | | | | | | |
| 10 | 9.1* | 1.04 | 6.05 | 5.08 | 1.11 | — | — | — | — | — | — | — | remainder |
| 11 | 32.1* | 1.11 | 6.04 | 5.10 | 1.07 | — | — | — | — | — | — | — | " |
| 12 | 19.4 | —* | 5.98 | 5.24 | 0.94 | — | — | — | — | — | — | — | " |
| 13 | 20.0 | 0.95 | 0.06* | 6.71 | 0.95 | — | — | — | — | — | — | — | " |
| 14 | 50.5 | 0.97 | 8.94* | 3.58 | 0.97 | — | — | — | — | — | — | — | " |
| 15 | 21.3 | 1.01 | 5.79 | —* | 1.02 | — | — | — | — | — | — | — | " |
| 16 | 20.4 | 1.08 | 5.90 | 8.14* | 1.03 | — | — | — | — | — | — | — | " |
| 17 | 18.7 | 1.07 | 6.03 | 6.02 | —* | — | — | — | — | — | — | — | " |

*outside the scope of the present invention specimens were subjected to a slow strain rate tensile test at a temperature of 320° C., with a pressure of 157 kg/cm² and a stress velocity of 0.5 μm/min, and the stress corrosion cracking fracture rate was measured for each test specimen by examining the fracture surface of each of the test specimens after they had fractured.

A corrosion test was also conducted in order to evaluate the corrosion resistance of the test specimens, by dipping each of the test specimens in the above-mentioned aqueous solution kept at room temperature, for 500 hours and the weight loss due to corrosion was measured for each of the test specimens.

Results of these tests are shown in Table 4.

Additionally, a small cubic test specimen of 0.7 mm × 0.7 mm × 0.7 mm was cut out of each of the above-mentioned nickel base alloy test specimens. the solidification temperature range of each of the cubic test

TABLE 4

| | crystal structure | tensile strength (kg/mm²) | stress corrosion crack fracture ratio (%) | corrosion loss (mg/cm²) | solidification temp. range (°C.) |
|---|---|---|---|---|---|
| cast pieces of Ni base alloys of the present invention | | | | | |
| 30 | single crystal | 155.3 | 0 | 3.9 | 48 |
| 31 | single crystal | 149.6 | 0 | 2.5 | 56 |
| 32 | single crystal | 136.5 | 3 | 1.5 | 70 |

TABLE 4-continued

| | crystal structure | tensile strength (kg/mm²) | stress corrosion crack fracture ratio (%) | corrosion loss (mg/cm²) | solidification temp. range (°C.) |
|---|---|---|---|---|---|
| 33 | single crystal | 124.5 | 0 | 2.7 | 47 |
| 34 | single crystal | 159.3 | 0 | 3.1 | 72 |
| 35 | single crystal | 122.5 | 0 | 3.0 | 48 |
| 36 | single crystal | 157.5 | 0 | 3.2 | 65 |
| 37 | single crystal | 130.3 | 0 | 3.0 | 54 |
| 38 | single crystal | 157.4 | 0 | 2.9 | 60 |
| 39 | single crystal | 145.0 | 0 | 2.6 | 70 |
| 40 | single crystal | 149.4 | 0 | 2.9 | 54 |
| 41 | single crystal | 149.8 | 1 | 1.5 | 71 |
| 42 | single crystal | 130.3 | 0 | 1.6 | 73 |
| 43 | single crystal | 153.6 | 1 | 1.5 | 70 |
| 44 | single crystal | 133.0 | 0 | 1.7 | 72 |
| 45 | single crystal | 153.4 | 1 | 1.5 | 68 |
| 46 | single crystal | 140.7 | 0 | 1.6 | 67 |
| 47 | single crystal | 138.1 | 0 | 1.5 | 73 |
| 48 | single crystal | 131.9 | 0 | 1.7 | 70 |
| 49 | single crystal | 141.8 | 0 | 1.6 | 71 |
| 50 | single crystal | 130.3 | 0 | 1.5 | 73 |
| 51 | single crystal | 153.1 | 0 | 2.4 | 58 |
| 52 | single crystal | 135.9 | 0 | 2.1 | 59 |
| 53 | single crystal | 144.0 | 0 | 2.3 | 57 |
| 54 | single crystal | 136.5 | 0 | 2.0 | 59 |
| 55 | single crystal | 136.9 | 0 | 1.8 | 60 |
| 56 | single crystal | 130.0 | 0 | 1.6 | 62 |
| 57 | single crystal | 140.2 | 0 | 2.4 | 58 |
| 58 | single crystal | 136.3 | 0 | 1.9 | 57 |
| 59 | single crystal | 120.8 | 0 | 1.6 | 61 |
| 60 | single crystal | 124.4 | 0 | 2.2 | 58 |
| 61 | single crystal | 118.7 | 0 | 1.7 | 65 |
| 62 | single crystal | 130.2 | 0 | 2.0 | 67 |
| 63 | single crystal | 141.0 | 0 | 3.8 | 58 |
| 64 | single crystal | 138.7 | 0 | 3.2 | 69 |
| 65 | single crystal | 137.9 | 0 | 1.9 | 66 |
| cast pieces of comparative Ni base alloys | | | | | |
| 10 | single crystal | 157.0 | 0 | 6.5 | 57 |
| 11 | multiple crystal | 61.4 | 31 | 1.3 | 93 |
| 12 | single crystal | 99.7 | 0 | 3.2 | 49 |
| 13 | single crystal | 100.4 | 0 | 3.0 | 52 |
| 14 | multiple crystal | 57.5 | 38 | 3.4 | 117 |
| 15 | single crystal | 104.2 | 0 | 3.0 | 55 |
| 16 | multiple crystal | 53.7 | 37 | 2.9 | 121 |
| 17 | multiple | 56.8 | 35 | 2.7 | 102 |

It is apparent from the test results in the Table 4 that nickel base alloy test specimens No. 30–65 of the present invention which have a single crystal structure composed of γ phase matrix and intermetallic compounds of γ' and γ" phases precipitated and dispersed in the matrix, exhibited the high tensile strength, stress corrosion cracking resistance and corrosion resistance as compared with the conventional comparative nickel base single crystal alloy test specimens, in addition to an extremely narrow solidification temperature range as compared with the conventional nickel base single crystal cast alloy.

Additionally, the stress corrosion cracking resistance and corrosion resistance of the nickel alloy has been improved by adding one or more elements selected from the group consisting of copper, and one or both of hafnium and rhenium thereto.

On the other hand, the conventional comparative nickel base single crystal alloy test specimens No. 10–17, which have an alloying element content outside the scope of the present invention, clearly exhibit some inferior properties to those of the nickel alloy of the present invention.

As particularly explained above, since the nickel base alloy of the second invention has such excellent properties and a narrow solidification temperature range, which enables easy formation of a single crystal structure, an increase in the cast piece pulling-down velocity and the production of larger sized cast pieces thereby becomes possible, which results in an improvement in a productivity of the nickel base single crystal cast alloy along with other economic advantages.

Although the first and second inventions of the present application have been explained in detail with reference to the preferred embodiments, it will be clearly understood to those skilled in the art that the present inventions are not restricted to such embodiments or examples but many variations may be made thereto without departing from the spirit and scope of the present inventions.

What is claimed is:

1. A precipitation strengthenable nickel base single crystal alloy which consists essentially of, on a weight percent basis,
   10–30% chromium,
   0.1–5% niobium,
   3.5–8% titanium,
   0.1–8% aluminum,
   0.05–0.5% copper, optionally, 0.05-3% of hafnium or rhenium or both,
optionally, 0.05-3% of molybdenum or tungsten or both,
optionally, 0.05-0.5% of boron or zirconium or both, and
the remainder being nickel and incidental impurities, and exhibits high tensile strength, corrosion resistance and stress corrosion resistance.

2. The alloy according to claim 1 which comprises 0.05-3% of hafnium or rhenium or both.

3. The alloy according to claim 2 which comprises 0.05-3% of molybdenum or tungsten or both.

4. The alloy according to claim 3, which comprises 0.05-0.5% of boron or zirconium or both.

5. The alloy according to claim 1 which comprises 0.05-0.5% of boron or zirconium or both.

6. The alloy according to claim 1, wherein the alloy is selected from the group consisting of
(a) 10.4 wt. % Cr, 1.01 wt. % Nb, 5.02 wt. % Ti, 5 wt. % Al, 0.12 wt. % Cu, the remainder Ni and inevitable impurities;
(b) 20.6 wt. % Cr, 1.03 wt. % Nb, 5.11 wt. % Ti, 5.02 wt. % Al, 0.20 wt. % Cu, the remainder Ni and inevitable impurities;
(c) 29.6 wt. % Cr, 0.97 wt. % Nb, 5.05 wt. % Ti, 4.79 wt. % Al, 0.13 wt. % Cu, the remainder Ni and inevitable impurities;
(d) 20.1 wt. % Cr, 0.12 wt. % Nb, 5.07 wt. % Ti, 4.52 wt. % Al, 0.15 wt. % Cu, the remainder Ni and inevitable impurities;
(e) 19.8 wt. % Cr, 4.91 wt. % Nb, 4.66 wt. % Ti, 4.35 wt. % Al, 0.18 wt. % Cu, the remainder Ni and inevitable impurities;
(f) 22.5 wt. % Cr, 1.20 wt. % Nb, 7.94 wt. % Ti, 1.09 wt. % Al, 0.21 Cu, the remainder Ni and inevitable impurities;
(g) 18.2 wt. % Cr, 1.18 wt. % Nb, 6.35 wt. % Ti, 0.12 wt. % Al, 0.14 wt. % Cu, the remainder Ni and inevitable impurities;
(h) 18.7 wt. % Cr, 1.04 wt. % Nb, 4.46 wt. % Ti, 4.28 wt. % Al, 0.07 wt. % Cu, the remainder Ni and inevitable impurities;
(i) 18.3 wt. % Cr, 1.16 wt. % Nb, 4.38 wt. % Ti, 4.25 wt. % Al, 0.48 wt. % Cu, the remainder Ni and inevitable impurities;
(j) 18.6 wt. % Cr, 1.22 wt. % Nb, 4.79 wt. % Ti, 4.29 wt. % Al, 0.07 wt. % Cu, 0.06 wt. % Hf, the remainder Ni and inevitable impurities;
(k) 19.0 wt. % Cr, 1.03 wt. % Nb, 5.04 wt. % Ti, 4.24 wt. % Al, 0.07 wt. % Cu, 1.53 wt. % Hf, the remainder Ni and inevitable impurities; p1 (l) 19.5 wt. % Cr, 1.21 wt. % Nb, 5.03 wt. % Ti, 4.08 wt. % Al, 0.07 wt. % Cu, 2.94 wt. % Hf, the remainder Ni and inevitable impurities;
(m) 19.8 wt. % Cr, 1.05 wt. % Nb, 5.01 wt. % Ti, 4.01 wt. % Al, 0.07 wt. % Cu, 0.06 wt. % Re, the remainder Ni and inevitable impurities;
(n) 20.2 wt. % Cr, 1.24 wt. % Nb, 4.82 wt. % Ti, 4.57 wt. % Al, 0.07 wt. % Cu, 1.49 wt. % Re, the remainder Ni and inevitable impurities;
(o) 20.6 wt. % Cr, 1.16 wt. % Nb, 4.97 wt. % Ti, 4.53 wt. % Al, 0.07 wt. % Cu, 2.96 wt. % Re, the remainder Ni and inevitable impurities;
(p) 19.7 wt. % Cr, 1.21 wt. % Nb, 4.88 wt. % Ti, 4.33 wt. % Al, 0.18 wt. % Cu, 0.64 wt. % Hf, 0.75 wt. % Re, the remainder Ni and inevitable impurities;
(g) 19.6 wt. % Cr, 1.14 wt. % Nb, 4.96 wt. % Ti, 4.67 wt. % Al, 0.07 wt. % Cu, 0.08 wt. % Re, 0.13 wt. % Mo, the remainder Ni and inevitable impurities;
(r) 20.3 wt. % Cr, 1.16 Nb, 5.02 wt. % Ti, 5.01 wt. % Al, 0.12 wt. % Cu, 0.12 wt. % Hf, 1.64 wt. % Mo, the remainder Ni and inevitable impurities;
(s) 20.4 wt. % Cr, 1.05 wt. % Nb, 5.04 wt. % Ti, 5.05 wt. % Al, 0.14 wt. % Cu, 0.14 wt. % Hf, 0.08 wt. % Re, 2.94 wt. % Mo, the remainder Ni and inevitable impurities;
(t) 21.0 wt. % Cr, 1.2 wt. % Nb, 5.02 wt. % Ti, 4.96 wt. % Al, 0.21 wt. % Cu, 0.12 wt. % Hf, 0.12 wt. % W, the remainder Ni and inevitable impurities;
(u) 18.5 wt. % Cr, 1.22 wt. % Nb, 4.97 wt. % Ti, 4.72 wt. % Al, 0.14 wt. % Cu, 0.09 wt. % Hf, 0.10 wt. % Re, 1.36 wt. % W, the remainder Ni and inevitable impurities;
(v) 19.2 wt. % Cr, 1.04 wt. % Nb, 4.98 wt. % Ti, 5.04 wt. % Al, 0.16 wt. % Cu, 0.13 wt. % Re, 2.87 wt. % W, the remainder Ni and inevitable impurities;
(w) 20.3 wt. % Cr, 1.07 Nb, 5.00 wt. % Ti, 5.07 wt. % Al, 0.18 wt. % Cu, 0.08 wt. % Hf, 1.10 wt. % Mo, 1.04 wt. % W, the remainder Ni and inevitable impurities;
(x) 19.3 wt. % Cr, 0.81 wt. % Nb, 4.69 wt. % Ti, 3.01 wt. % Al, 0.12 wt. % Cu, 0.08 wt. % B, the remainder Ni and inevitable impurities;
(y) 18.5 wt. % Cr, 1.03 wt. % Nb, 4.82 wt. % Ti, 4.03 wt. % Al, 0.15 wt. % Cu, 0.18 wt. % Zr, the remainder Ni and inevitable impurities;
(z) 18.4 wt. % Cr, 1.24 wt. % Nb, 4.51 wt. % Ti, 4.20 wt. % Al, 0.2 wt. % Cu, 0.15 wt. % B, 0.09 wt. % Zr, the remainder Ni and inevitable impurities and
(aa) 19.8 wt. % Cr, 1.14 wt. % Nb, 4.81 wt. % Ti, 3.95 wt. % Al, 0.21 wt. % Cu, 0.48 wt. % Hf, 0.24 wt. % Re, 0.81 wt. % Mo, 0.12 wt. % W, 0.11 wt. % B, 0.21 wt. % Zr, the remainder Ni and inevitable impurities.

7. The alloy according to claim 1, wherein the alloy consists of, on a weight basis,
10 to 30% chromium,
0.1 to 5% niobium,
3.5 to 8% titanium,
0.05 to 0.5% copper,
optionally 0.05 to 3% hafnium or rhenium or both,
optionally 0.05 to 0.5% boron or zirconium or both,
and the remainder being nickel and incidental impurities.

8. A precipitation strengtherable nickel base single crystal alloy, which consists essentially of, on a weight percent basis,
10-30% chromium,
0.1-5% niobium,
3.5-8% titanium,
0.1-8% aluminum,
0.1-3% tantalum,
0.05-0.5% copper
optionally one or more components selected from the group consisting of 0.05-3% hafnium and 0.05-3% rhenium, sum of copper, hafnium and rhenium being not more than 3%,
optionally 0.05-3% of molybdenum or tungsten or both,
optionally 0.05-0.5% of boron or zirconium or both, and
the remainder being nickel and incidental impurities, and exhibits a narrow solidification temperature range.

9. The alloy according to claim 8 which comprises one or more components selected from the group consisting of 0.05-0.5% copper, 0.05-3% hafnium and 0.05-3% rhenium, sum of copper, hafnium and rhenium being restricted in the range of not more than 3%.

10. The alloy according to claim 8 which comprises 0.05-3% of molybdenum or tungsten or both.

11. The alloy according to claim 9 which comprises 0.05-3% of molybdenum or tungsten or both.

12. The alloy according to claim 11, which comprises 0.05-0.5% of boron or zirconium or both.

13. The alloy according to claim 8 which comprises 0.05-0.5% of boron or zirconium or both.

14. The alloy according to claim 8, wherein the alloy is selected from the group consisting of
   (a) 29.2 wt. % Cr, 1.11 wt. % Nb, 5.62 wt. % Ti, 5.08 wt. % Al, 1.01 wt. % Ta, 0.06 wt. % Cu, the remainder Ni and inevitable impurities;
   (b) 29.5 wt. % Cr, 1.11 wt. % Nb, 5.88 wt. % Ti, 5.04 wt. % Al, 0.96 wt. % Ta, 0.42 wt. % Cu, the remainder Ni and inevitable impurities;
   (c) 29.5 wt. % Cr, 1.09 wt. % Nb, 6.08 wt. % Ti, 4.95 wt. % Al, 0.98 wt. % Ta, 0.24 wt. % Cu, 1.41 wt. % Hf, the remainder Ni and inevitable impurities;
   (d) 28.8 wt. % Cr, 1 wt. % Nb, 5.81 wt. % Ti, 5.26 wt. % Al, 0.97 wt. % Ta, 0.13 wt. % Cu, 2.33 wt. % Re, the remainder Ni and inevitable impurities;
   (e) 28.7 wt. % Cr, 1.13 wt. % Nb, 6.15 wt. % Ti, 5.01 wt. % Al, 1.04 wt. % Ta, 0.3 wt. % Cu, 0.74 wt. % Hf, 0.52 wt. % Re, the remainder Ni and inevitable impurities;
   (f) 20.4 wt. % Cr, 1.10 wt. % Nb, 6.1 wt. % Ti, 5.02 wt. % Al, 0.97 wt. % Ta, 0.33 wt. % Cu, 2.81 wt. % W, the remainder Ni and inevitable impurities;
   (g) 18.6 wt. % Cr, 0.95 wt. % Nb, 6.09 wt. % Ti, 5.07 wt. % Al, 0.98 wt. % Ta, 0.24 wt. % Hf, 0.24 wt. % Re, 0.36 wt. % Mo, 0.58 wt. % W, the remainder Ni and inevitable impurities;
   18.9 wt. % Cr, 0.92 wt. % Nb, 6.11 wt. % Ti, 5.05 wt. % Al, 1.04 wt % Ta, 0.21 wt. % Cu, 0.48 wt. % Hf, 1.12 wt. % Re, 1.01 wt. % Mo, 1.21 wt. % W, the remainder Ni and inevitable impurities;
   (i) 21.2 wt. % Cr, 0.95 wt. % Nb, 5.72 wt. % Ti, 4.13 wt. % Al, 0.89 wt. % Ta, 0.21 wt. % Cu, 0.12 wt. % B, the remainder Ni and inevitable impurities;
   (j) 18.8 wt. % Cr, 0.94 wt. % Nb, 5.25 wt. % Ti, 3.98 wt. % Al, 1 wt. % Ta, 0.18 wt. % Cu, 0.40 wt. % Zr, the remainder Ni and inevitable impurities;
   (k) 19.5 wt. % Cr, 1.07 wt. % Nb, 5.89 wt. % Ti, 4.21 wt. % Al, 0.97 wt. % Ta, 0.30 wt. % Cu, 0.14 wt. % B, 0.25 wt. % Zr, the remainder Ni and inevitable impurities; and
   (l) 18.4 wt. % Cr, 1.04 wt. % Nb, 5.53 wt. % Ti, 4.18 wt. % Al, 0.93 wt. % Ta, 0.27 wt. % Cu, 0.21 wt. % Hf, 0.41 wt. % Re, 0.9 wt. % Mo, 1 wt. % W, 0.08 wt. % B, 0.21 wt. % Zr, the remainder Ni and inevitable impurities.

15. The alloy according to claim 8, wherein the alloy consists of, on a weight basis,
   10 to 30% chromium,
   0.1 to 5% niobium,
   3.5 to 8% titanium,
   0.1 to 8% aluminum,
   0.1 to 3% tantalum,
   0.05 to 5% copper,
   optionally one or more elements selected from the group consisting of 0.05 to 3% hafnium and 0.05 to 3% rhenium, the sum of the copper, hafnium and rhenium being not more than 3%, optionally 0.05 to 3% molybdenum or tungsten or both,
   optionally 0.05 to 0.5% boron or zirconium or both and the remainder being nickel and incidental impurities.

* * * * *